(12) United States Patent
Hashikura et al.

(10) Patent No.: US 7,414,823 B2
(45) Date of Patent: Aug. 19, 2008

(54) HOLDER FOR USE IN SEMICONDUCTOR OR LIQUID-CRYSTAL MANUFACTURING DEVICE AND SEMICONDUCTOR OR LIQUID-CRYSTAL MANUFACTURING DEVICE IN WHICH THE HOLDER IS INSTALLED

(75) Inventors: Manabu Hashikura, Itami (JP); Hirohiko Nakata, Itami (JP); Akira Kuibira, Itami (JP); Masuhiro Natsuhara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/709,889

(22) Filed: Jun. 3, 2004

(65) Prior Publication Data

US 2004/0244695 A1 Dec. 9, 2004
US 2007/0095291 A9 May 3, 2007

(30) Foreign Application Priority Data

Jun. 5, 2003 (JP) .............................. 2003-160161

(51) Int. Cl.
*H01L 21/683* (2006.01)
*H02N 13/00* (2006.01)

(52) U.S. Cl. .................. 361/234; 361/115; 118/725; 118/728; 257/648; 257/703

(58) Field of Classification Search ................ 361/234; 118/725; 257/648, 703
See application file for complete search history.

(56) References Cited

U.S. PATENT DOCUMENTS

| 5,625,526 A * | 4/1997 | Watanabe et al. ........... 361/234 |
| 6,490,146 B2 * | 12/2002 | Wang et al. .................. 361/234 |
| 6,508,884 B2 * | 1/2003 | Kuibira et al. .............. 118/725 |
| 6,693,789 B2 * | 2/2004 | Inazumachi et al. ......... 361/234 |
| 6,693,790 B2 * | 2/2004 | Matsuki et al. ............. 361/234 |
| 2003/0064225 A1 * | 4/2003 | Ohashi et al. ............... 428/408 |

FOREIGN PATENT DOCUMENTS

| JP | H04-078138 A | 3/1992 |
| JP | 2001-118664 A | 4/2001 |

OTHER PUBLICATIONS

Merriam-Webster's Collegiate Dictionary, tenth edition, p. 236.*

* cited by examiner

*Primary Examiner*—Dao H Nguyen
(74) *Attorney, Agent, or Firm*—James W. Judge

(57) ABSTRACT

Affords a holder for use in semiconductor or liquid-crystal manufacturing devices—as well as semiconductor or liquid-crystal manufacturing devices in which the holder is installed—in which temperature uniformity in the processed-object retaining face is heightened. Configuring the holder with, furnished atop a ceramic susceptor, a composite of a ceramic and a metal improves the temperature uniformity in the holder's processed-object retaining face and makes for curtailing the generation of particulates and other contaminants. In addition, putting a coating on at least the retaining face improves the durability of the holder. Installing a holder of this sort in a semiconductor manufacturing device or a liquid-crystal manufacturing device contributes to making available semiconductor or liquid-crystal manufacturing devices whose productivity and throughput are excellent.

16 Claims, 4 Drawing Sheets

HOLDER FOR USE IN SEMICONDUCTOR OR LIQUID-CRYSTAL MANUFACTURING DEVICE AND SEMICONDUCTOR OR LIQUID-CRYSTAL MANUFACTURING DEVICE IN WHICH THE HOLDER IS INSTALLED

BACKGROUND OF INVENTION

1. Field of the Invention

The present invention relates to holders employed in semiconductor manufacturing devices or in liquid-crystal manufacturing devices—such as equipment for plasma CVD, low-pressure CVD, metal CVD, dielectric CVD, ion-implantation, etching, low-k deposition, and degassing—and furthermore to semiconductor or liquid-crystal manufacturing devices in which the holders are installed.

2. Background Art

Conventionally, in semiconductor or liquid-crystal manufacturing procedures various processes, such as film deposition processes and etching processes, are carried out on semiconductor substrates or liquid-crystal containing glass plates (LCD glass) that are the processed objects. Ceramic susceptors, which are both for retaining semiconductor substrates or LCD glass, and for heating semiconductor substrates or LCD glass, are used in the processing devices in which such processes on semiconductor substrates or LCD glass are carried out.

Japanese Unexamined Pat. App. Pub. No. H04-78138 for example discloses a conventional ceramic susceptor of this sort. The ceramic susceptor disclosed in H04-78138 includes: a heater part made of ceramic—into which a resistive heating element is embedded and that is provided with a wafer-heating surface—arranged within a chamber; a columnar support part that is provided on the side other than the wafer-heating side of the heater part, and that forms a gastight seal between it and the chamber; and electrodes connected to the resistive heating element and leading outside the chamber so as essentially not to be exposed to the chamber interior space.

Although this invention serves to remedy the contamination and poor thermal efficiency that had been seen with the metal heaters that had gone earlier, it does not touch upon temperature distribution in semiconductor substrates being processed. Nonetheless, semiconductor-substrate temperature distribution is crucial in that it proves to be intimately related to yield in the situations where the various processes just noted are carried out. Given the importance of temperature distribution, Japanese Unexamined Pat. App. Pub. No. 2001-118664, for example, discloses a ceramic susceptor capable of equalizing the temperature of its ceramic substrate. In terms of this invention, it is tolerable in practice that the temperature differential between the highest and lowest temperatures in the ceramic substrate surface be within in several %.

Scaling-up of semiconductor substrates as well as LCD glass has been moving forward in recent years, however. For example, with the silicon (Si) wafers that are semiconductor substrates, a transition from 8 inches to 12 inches in wafer diameter is in progress. Likewise with LCD glass, scaling-up to an extremely large 1500 mm×1800 mm, for example, is underway. Consequent on this enlarging of semiconductor substrates as well as LCD glass in diametric span, that the temperature distribution in the processed-object retaining surface (heating surface) of ceramic susceptors be within ±1.0% has become a necessity; that it be within ±0.5% has, moreover, come to be the expectation.

Ceramics of high thermal conductivity are utilized as a means to improve temperature uniformity in the wafer-retaining side of ceramic susceptors. Heat issuing from the resistive heating element disperses readily through the susceptor interior if the ceramic thermal conductivity is high, making for enhanced temperature uniformity in the retaining surface.

Since current is passed through the resistive heating element to have it generate heat, the ceramic must be an electrical insulator. With ceramics that are insulative those that have high thermal conductivity are limited, however. For example, although diamond of 2000 W/mK thermal conductivity and c-BN (cubic boron nitride) of 500 W/mK are available, with either of these being a material that can be procured only under ultra-high pressure and temperature conditions they are extraordinarily high-priced and there is a limit to their manufacturable size; thus they cannot be utilized in a ceramic susceptor that is the object of the present invention.

Another problem has been that to improve the temperature uniformity of ceramics generally used in susceptors, such as $Al_2O_3$, AlN, $Si_3N_4$, and SiC, the susceptors should be made thick, but making them thick retards the heat-up and cool-down speeds, meaning that since throughput cannot be raised productivity suffers.

A further problem is that because ceramics are materials that either have an extremely high melting point, or that do not have a melting point, melting and casting ceramics or heating and roll-milling cast ceramic blocks in the way metals are presents difficulties. Consequently, to make ceramic susceptors thicker, and to enlarge them diametrically to over 200 mm has entailed a quantum leap in cost. And a further difficulty has been that because these ceramics are fragile materials they break when subject to localized heat stress.

Apart from temperature uniformity as just discussed, another issue has been that in carrying out the different processes mentioned earlier, the generation of contaminants and particulate debris from metallic impurities has to be restrained to the utmost because of the seriously negative impact that the contaminants and particulates would have on the quality of the semiconductors and liquid crystals that are fabricated.

SUMMARY OF INVENTION

The present invention has been brought about to resolve the foregoing issues. That is, an object of the present invention is to make available a holder for use in semiconductor or liquid-crystal manufacturing devices, as well as semiconductor or liquid-crystal manufacturing devices in which the holder is installed, with which temperature uniformity in the surface of semiconductor wafers or LCD glass is enhanced and generation of contaminants and particulates is minimal, and in which resistance to thermal shock is superior, costs are lowered and production efficiency is excellent.

A holder of the present invention for use in semiconductor or liquid-crystal manufacturing devices is characterized in being furnished with a ceramic-and-metal composite atop a ceramic susceptor. The Young's modulus of the ceramic-and-metal composite is preferably 300 GPa or less. The thermal conductivity of the ceramic-and-metal composite is preferably 100 W/mK or more, while the thermal expansion coefficient is preferably $2.5 \times 10^{-6}$ to $8.0 \times 10^{-6}/°$ C.

In another aspect of the present invention the holder for use in semiconductor or liquid-crystal manufacturing devices preferably has a support part that supports either the ceramic-and-metal composite or the ceramic susceptor, or both. It is also preferable that a coating be formed on at least the processed-object-retaining side of the holder. In a further aspect the ceramic-and-metal composite may be made to function as an electrode.

A holder as described above advantageously is installed in semiconductor or liquid-crystal manufacturing devices. In such semiconductor or liquid-crystal manufacturing devices, inasmuch as the surface temperature of the wafers and LCD glass that are the processed objects proves to be more uniform than with conventional holders made of ceramic, and at the same time resistance to thermal shock is superior and generation of contaminants and particulates is almost nil, high-quality semiconductor or liquid crystal display devices can be manufactured with good throughput.

From the following detailed description in conjunction with the accompanying drawings, the foregoing and other objects, features, aspects and advantages of the present invention will become readily apparent to those skilled in the art.

DETAILED DESCRIPTION

Figure 1A:
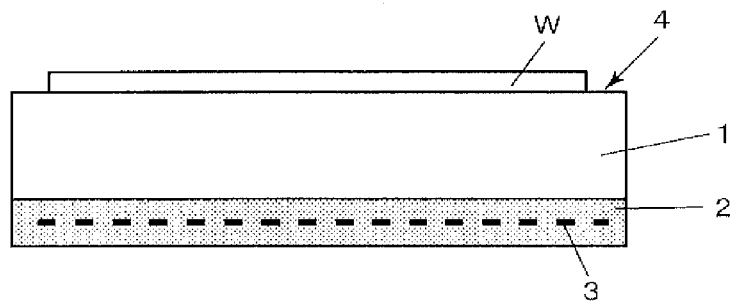
FIG. 1 illustrates an example of the cross-sectional structure of a holder of the present invention.

Ceramic-and-metal composites (ceramic-metal composites hereinafter) have high thermal conductivities; moreover their Young's moduli are higher than that of metals, and their toughness is greater than that of ceramics. Accordingly, rendering a ceramic-metal composite into a holder 1 for semiconductor or liquid-crystal manufacturing devices facilitates achieving temperature uniformity in the retaining face 4 of the holder 1 (FIGS. 1A and 1B), and makes the holder unlikely to break even in situations in which localized heat stress is put on the holder. Nevertheless, owing to the electroconductivity of ceramic-metal composites, a conductive layer cannot be formed directly onto a ceramic-metal composite.

In respect of these features, it was discovered that the above-described holder being, as represented in FIG. 1, furnished with a ceramic-metal composite 1 atop ceramic susceptor 2 made for a significant improvement in surface temperature uniformity of the processed object w, and moreover made the cost of the holder inexpensive.

Scaling up ceramic-metal composites is a simple matter because they may be fabricated by, for example, such methods as infiltrating metal into porous ceramic, or blending and post-mold sintering ceramic powder with metal powder. In particular, in fabricating large-scale ceramic-metal composites, infiltration and sintering can be carried out at low temperatures compared with the fabrication of isolated ceramics, and this together with the fact that due to their pronounced toughness ceramic-metal composites are not liable to crack means that compared with ceramics the cost of employing ceramic-metal composites is markedly less.

The Young's modulus of a ceramic-metal composite employed in the present invention should be higher than that of metals, but because the toughness deteriorates if the modulus is too high, it preferably is 300 GPa or less. Making it 300 GPa or less minimizes the incidence of cracking due to heat stress. Further, while a higher thermal conductivity is the more preferable, advantageously the ceramic-metal composite will have a thermal conductivity of 100 W/mK or more, because uniformity in the temperature of an object processed on the holder will be enhanced to achieve effects of the present invention.

A further advantage is that since the coefficient of thermal expansion of a ceramic-metal composite can be altered by varying the ceramic and metal proportions, the thermal expansion coefficient of the ceramic-metal composite can be adjusted to match the thermal expansion coefficient of the objects to be processed. In this way, damage to and deformation of the processed object and the holder, originating in the difference in thermal expansion coefficient between the holder and the processed object, can be held in check. Likewise, the thermal expansion coefficient of the ceramic-metal composite can be adjusted also to match the thermal expansion coefficient of the ceramic susceptor. In this way, damage to and deformation of the ceramic metal composite and ceramic susceptor, originating in the difference in thermal expansion coefficient between the ceramic metal composite and the ceramic susceptor, can be curtailed. For this purpose the thermal expansion coefficient of the ceramic-metal composite is preferably $2.5 \times 10^{-6}/°$ C. or more but $8.0 \times 10^{-6}/°$ C. or less.

Another advantage with ceramic-metal composites is that their corrosion resistance against the erosive gases employed in the course of fabricating semiconductors and liquid crystals is also high by comparison to metals. In addition, they excel in thermal resistance at high temperatures of 300° C. or more. What is more, matching the material properties of the ceramic and metal with the material properties of the processed objects eliminates concern that the processed objects will be contaminated.

Aluminum (Al), silicon (Si) and copper (Cu) may be given as examples of metals that constitute ceramic-metal composites of this sort. In turn, SiC, $Al_2O_3$, AlN, WC and BN may be given as examples of ceramics that do. Preferably at least one type each of these metals and ceramics are combined for a ceramic-metal composite of the present invention. In situations in which silicon wafers are the processed objects, since aluminum is often used for the material in the wiring pattern, the ceramic-metal composite preferably is at least one compound among Al—SiC, Al—$Al_2O_3$, Al—AlN, Si—SiC, Si—$Al_2O_3$ and Si—AlN.

It is preferable that the planarity of the processed-object retaining face of the ceramic-metal composite be within 500 □m and that the microroughness be 3 □m (Ra), because this enables the processed object to be heated uniformly and the temperature distribution in the front side of the processed object be brought to within ±1.0%.

The ceramic-metal composite is advantageously 200 or more in diameter because that size allows the holder to handle large-scale semiconductor wafers and LCD glass, and more prominently brings out the effectiveness of the present invention. Furthermore, the composite thickness desirably is made 50 mm or less, because making the thickness 50 mm or less enables rapid heat-up and cool-down, and improves the temperature uniformity of the retaining face.

In situations in which a holder of the present invention is employed once a vacuum is drawn in the interior of the device in which it is set up, in order to keep the pump-down time from dragging out due to the issuance of gas from the holder, the water absorption ratio of the ceramic-metal composite preferably is 0.03% or less. If the water absorption ratio exceeds 0.03% the time required for pump down will be prolonged, lowering the service-ability ratio of the facility and worsening production efficiency.

Figure 1B:
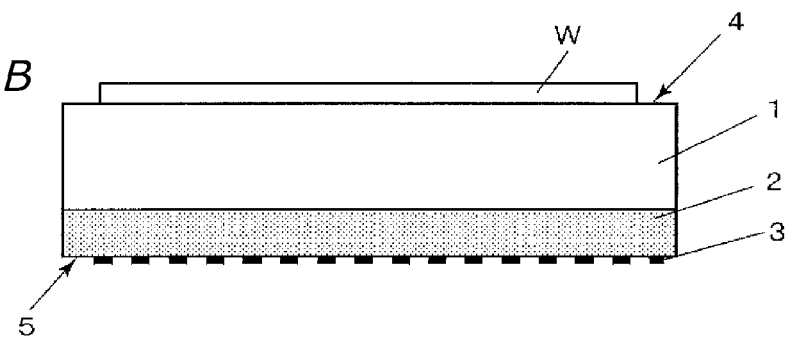

In situations in which the ceramic susceptor utilized underneath the ceramic-metal composite is of an electroconductive ceramic, an electrode may be attached to the susceptor to have the ceramic itself generate heat. In cases in which the ceramic is insulative, the ceramic susceptor may be one in which a resistive heating element circuit 3 as illustrated in FIG. 1A is embedded into the ceramic, or the resistive heating element circuit 3 may be formed on the face 5, as indicated in FIG. 1B, of the susceptor on the side opposite the face on which the ceramic-metal composite 1 is placed. In cases as in FIG. 1B in which the resistive heating element circuit is formed on the surface, an insulative coating preferably is spread over the resistive heating element circuit in order to protect it and to prevent it from deteriorating.

As far as the ceramic material of the susceptor is concerned, from the perspective of heat resistance desirably the material is at least one among the ceramics $Al_2O_3$, AlN, SiC, BN, $Si_3N_4$ and sialon (silicon aluminum oxynitride). AlN and SiC are particularly preferable since either excels in thermal conductivity and corrosion resistance—AlN being especially preferable on account of its outstanding resistance to corrosion.

It is desirable that at least one constituent selected from W, Mo, Pt, Pd, Ag, Ni and Cr be the principal component of the substance for resistive heating element. From the perspective of heat resistance it is preferable that the chief component be at least one constituent selected from W and Mo, with W being particularly preferable since it has a high melting point. Likewise, from the perspective of corrosion resistance it is preferable that the chief component be at least one constituent selected from Pt, Pd, Ag, Ni and Cr, with Pt and Pd being particularly preferable inasmuch as they excel in resistance to corrosion.

Furnishing a ceramic-metal composite atop a ceramic susceptor of this sort renders a holder for use in semiconductor or liquid-crystal manufacturing devices that is superior in temperature uniformity and resistance to thermal shock, and with which the incidence of contaminants and particulates is negligible. A ceramic susceptor atop which a ceramic-metal composite has simply been set will function as a holder of the present invention.

Nevertheless, should a gap be present in between the ceramic susceptor and the ceramic-metal composite, the heat generated in the susceptor would not be transferred effectively to the ceramic-metal composite. Given that possibility, it is desirable that the ceramic susceptor be mechanically coupled to the ceramic-metal composite. While for the mechanical coupling screws are convenient, utilizing spring clips or a snug-fitting configuration is also possible. If spring clips are used, preferably they are made of a ceramic whose spring constant at high temperature is not liable to decrease. The ceramic susceptor and the ceramic-metal composite can also be chemically bonded by matching their thermal expansion coefficients. Bonding the ceramic-metal composite and the ceramic susceptor improves the adherence between them, which upgrades the heat transfer and therefore contributes to enhanced temperature uniformity.

A holder of a configuration as above in which a ceramic-metal composite is furnished atop a ceramic susceptor may be installed directly on the interior of the chamber 20 (FIG. 2) of a semiconductor or liquid-crystal manufacturing device. Nevertheless, since the heat generated by the ceramic susceptor is conveyed to the chamber if the holder is installed directly on the chamber interior—which can compromise the thermal efficiency and, with the chamber being heated excessively, can put the device out of commission—the holder preferably is provided with a support part.

Figure 2:
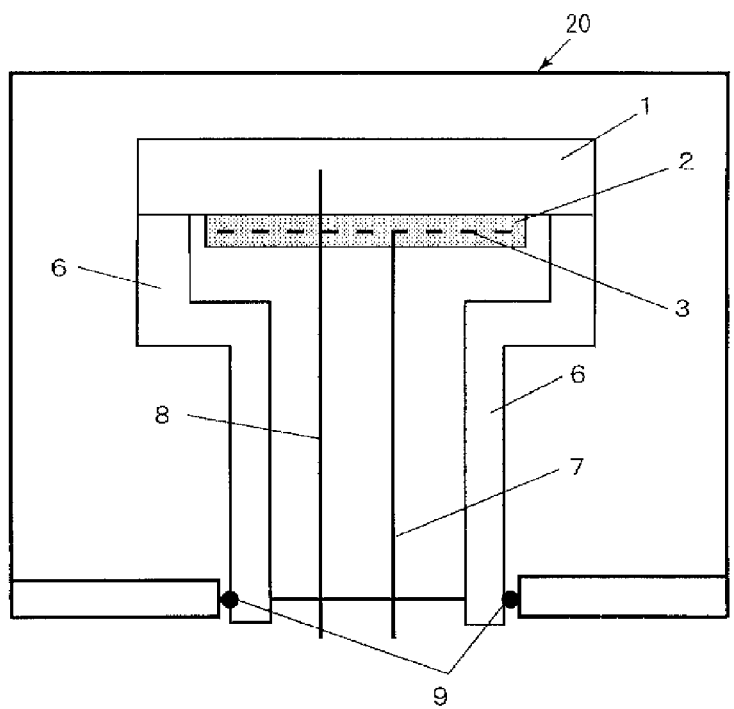
FIGS. 2-7 each illustrate a respectively different example of the cross-sectional structure of a holder of the present invention.
Figure 3:
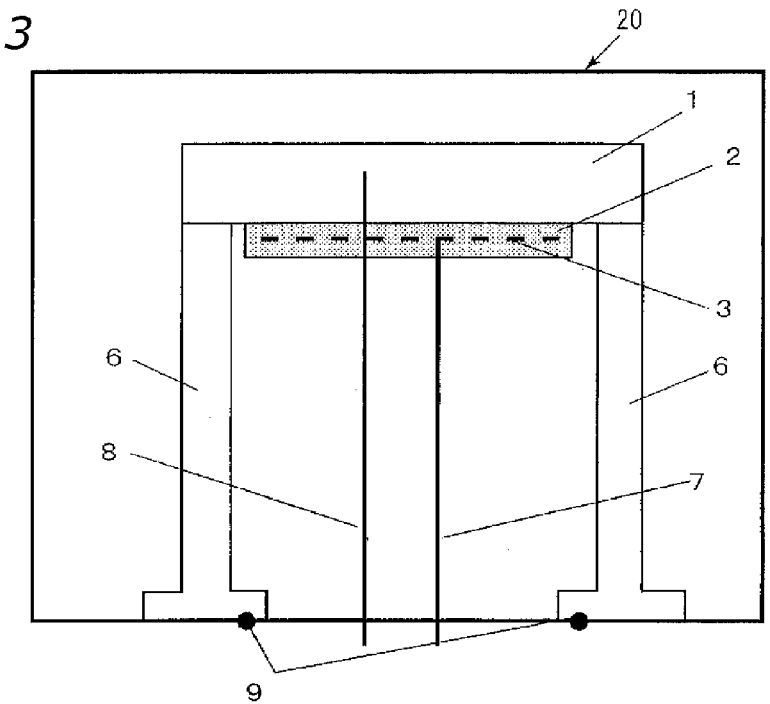
Figure 4:
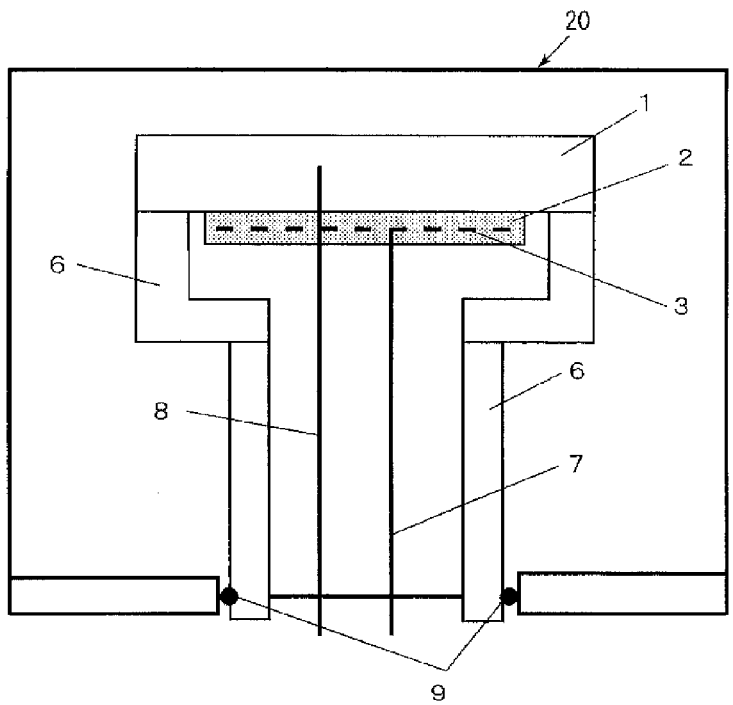
Figure 5:
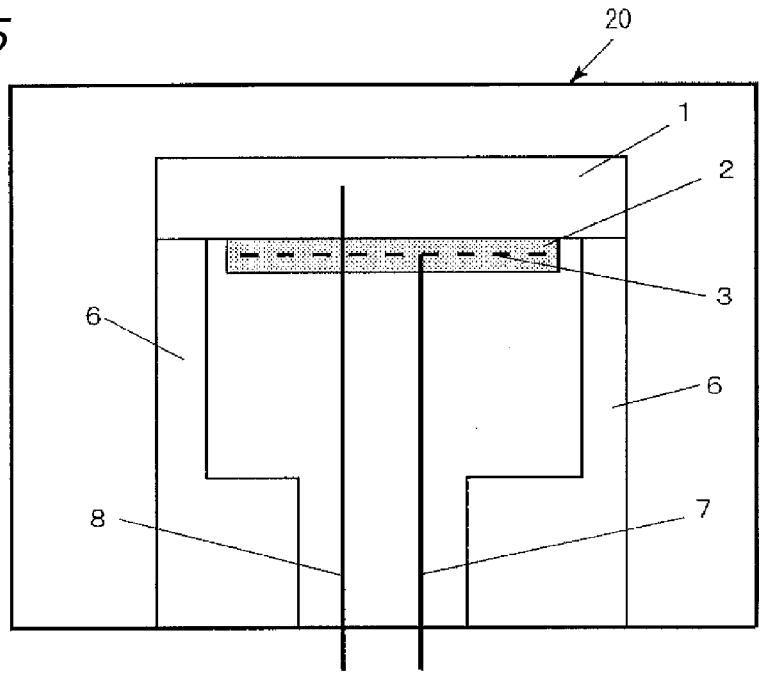

The support part may support at least a portion of either the ceramic-metal composite or the ceramic susceptor, or may support at least a portion of both. Specific single examples of the support part 6 are illustrated in FIG. 2 through FIG. 7. As depicted in FIG. 2, the ceramic-metal composite 1 is supported on the support part 6 and set up in the chamber 20 interior. A power-supplying electrode 7 and a thermocouple 8 are installed inside the support part 6. The support part 6 may be hermetically sealed into the chamber 20 via an O-ring 9 as indicated in FIGS. 2-4; furthermore, it may be anchored with bolts or the like.

The temperature of the area of the support part that is in contact with the semiconductor or liquid-crystal manufacturing device desirably is lower than the temperature of the ceramic susceptor. The support part and the ceramic-metal composite or the ceramic susceptor do not necessarily have to be fixed together; the ceramic-metal composite or susceptor may be simply set atop the support part. Anchoring them is, however, to be preferred in order to heighten the reliability of the support.

Mechanical compression by means of screws, pressure insertion, crimping, implanting, spring clipping, or elastic boards can be utilized as an anchoring method.

Particularly in situations in which corrosive gases are employed, in order to prevent components such as the power-supplying electrode 7 and thermocouple 8 installed within the support part from corroding due to the corrosive gases, the support part and the ceramic-metal composite or ceramic susceptor desirably are hermetically sealed. Utilizing a technique such as localized solid-state welding, glass bonding, brazing, snug-fitting, diffusion bonding, friction welding, and fusion welding a as hermetic sealing method will improve the reliability of the gastightness of the seal. Utilizing a localized solid-state welding, glass bonding, brazing, snug-fitting, or diffusion bonding technique is especially advantageous because it can make the gastightness of the joints $1.0 \times 10^{-9}$ Pa·m$^3$/s or less.

In making a gastight seal, the closer the thermal expansion coefficient of the support part, and the thermal expansion coefficient of the ceramic-metal composite or the ceramic susceptor are the better; substances whose difference in thermal expansion coefficient is $6 \times 10^{-6}$ or less are preferable.

If the difference in thermal expansion coefficient exceeds $6 \times 10^{-6}$, structural damage such as cracks can occur in the vicinity of the joint between the support part and the ceramic-metal composite or ceramic susceptor; even if cracks do not occur during joining, in the course of being repeatedly used the joint is subjected to heat cycling, which can produce fractures and cracks. In an instance in which the ceramic-metal composite is Al-AlN, for example, the optimal support part substance is AlN, but ceramics such as silicon nitride and silicon carbide, as well as mullite may be employed.

Figure 6:
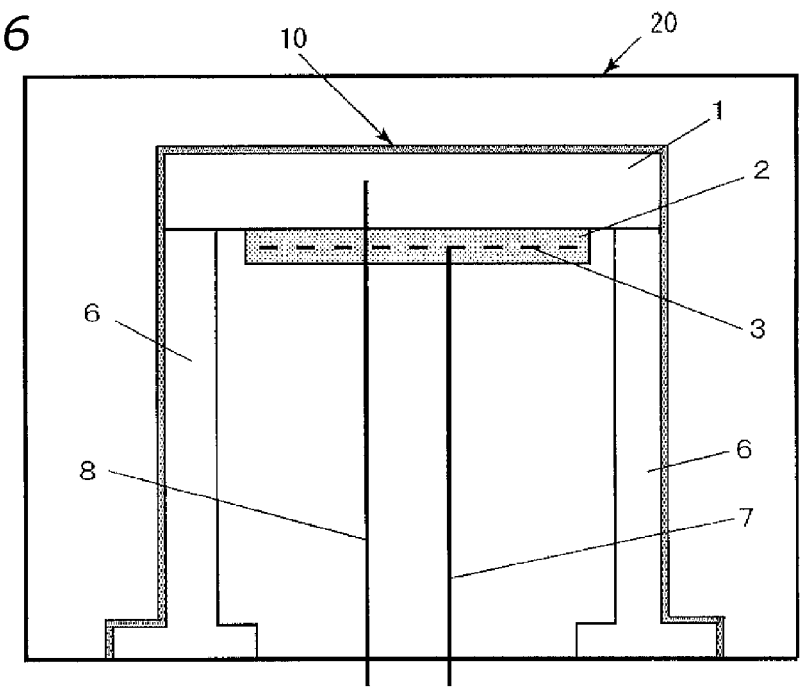

Again, in applications in which corrosive gases are employed, the fact that the ceramic-metal composite and the support part, and the joint between them, will be exposed to the corrosive gases means a likelihood of their corroding. In order to prevent such corrosion, as represented in FIG. 6 a coating 10 excelling in erosion resistance against corrosive gases preferably is coated over at least the processed-object retaining face of the holder. Preferable as coating materials are: Si, $SiO_2$, SiC, AlN, diamond-like carbon (DLC), diamond, sapphire ($Al_2O_3$), aluminum fluoride, and graphite.

Figure 7:
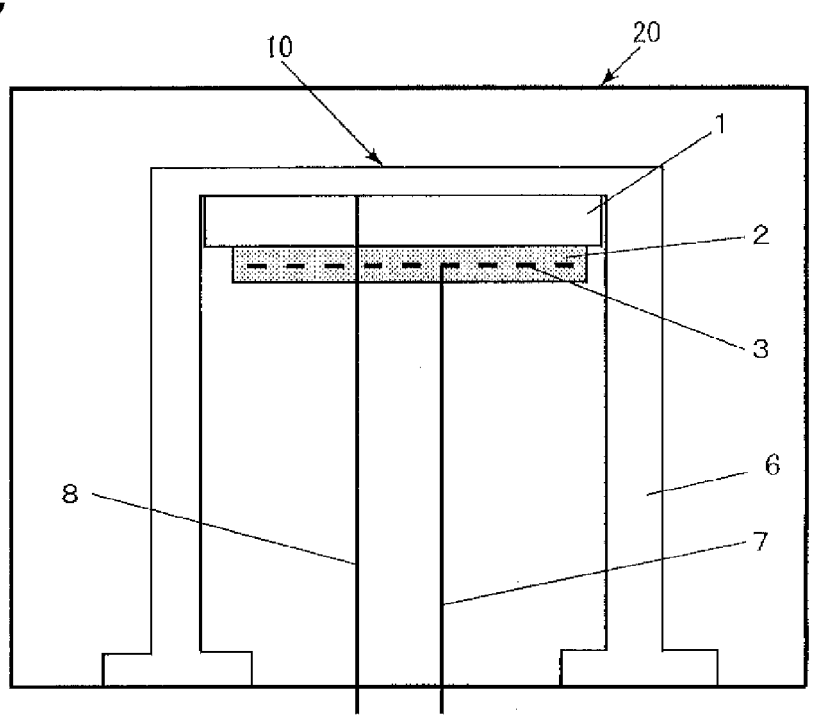

Alternatively, the ceramic-metal composite 1 and ceramic susceptor 2 may be covered, as illustrated in FIG. 7, by a member 6 that is highly anti-erosive against corrosive gases. For a member of this sort, Si, $SiO_2$, SiC, AlN, sapphire ($Al_2O_3$), aluminum fluoride, and graphite can be utilized; other than these, vitreous carbon can also be used.

As suggested earlier, inasmuch as a ceramic-metal composite of the present invention is electroconductive, the ceramic-metal composite can be utilized as an electrode. For example, rendering the composite an RF (high-frequency)

electrode for generating plasma eliminates the need for providing an RF electrode separate from the resistive heating element inside the ceramic matrix, which therefore contributes to reducing the cost of the holder. Another advantage is that in applications in which the ceramic-metal composite is made an electrode, there will be no restrictions on the mounting position for the power-supply electrode, which therefore increases the degrees of freedom for the device design. What is more, in applications having the support part detailed above, rendering the support part a ceramic-metal composite also, and providing a power-supplying terminal adjacent the end portion of the support part along the chamber eliminates the need for providing a power-supplying lead and therefore makes cost-reduced design possible.

As noted previously, a holder of the present invention can be incorporated into a semiconductor manufacturing device, wherein semiconductor wafers can be processed. Since the temperature in the wafer-retaining face of a holder of the present invention is uniform, the wafer temperature distribution also will be more uniform than is conventional, which contributes to achieving stabilized characteristics in terms of the films formed, the heating processes, etc.

As also noted previously, a holder of the present invention can be incorporated into a liquid-crystal manufacturing device, wherein LCD glass can be processed. Since the temperature in the LCD-glass retaining face of a holder of the present invention is uniform, the temperature distribution in the front side of the LCD glass also will be more uniform than is conventional, which contributes to achieving stabilized characteristics in terms of the films formed, the heating processes, etc.

EMBODIMENTS

Embodiment One

Commercially available ceramic-metal composites of 400 mm diameter, 10 mm thickness and made of Al—Al$_2$O$_3$ were readied. The processed-object retaining faces of the ceramic-metal composites were polished to finish the retaining face to a planarity of 0.03 mm and a microroughness of 0.7 µm (Ra). The water absorption ratio of the ceramic-metal composites was 0.00%. The Young's modulus, thermal expansion coefficient ($\alpha$), and thermal conductivity ($\kappa$) of the composites are set forth in Table I.

In addition, ceramic susceptors made of Al$_2$O$_3$, AlN, and SiC were prepared. By creating a heat-generating patterned circuit made of molybdenum on each of sintered ceramic pieces, laminating a separate sintered ceramic piece onto each of those, and bonding the laminate together using a hot press, ceramic susceptors into which a resistive heating element is embedded were produced. The ceramic susceptors were finished to an outer diameter of 350 mm, and a thickness of 10 mm.

It should be noted that also by a method in which green sheets of each of the ceramics just noted are created, a heat-generating patterned circuit is formed onto each green sheet using a molybdenum paste, and thereafter another green sheet is laminated onto and sintered together with each of those, ceramic susceptors into which a resistive heating element is embedded can produced.

The thermal expansion coefficient ($\alpha$), and thermal conductivity ($\kappa$) of each of the ceramic susceptors are set forth in Table II.

These ceramic susceptors 2 were fixed to the above-described ceramic-metal composites 1 utilizing screws (not illustrated) made of ceramic. In addition, respective support parts 6 as illustrated in FIG. 3, made from the same material as the ceramic susceptors, were glass-bonded to the ceramic-metal composites. The holders and support parts thus prepared were anchored with bolts to the interior of the chamber 20 of a semiconductor manufacturing device. A hermetical sealed between the bottom face of the support parts and the chamber was formed utilizing O-rings.

After creating setups in this way, a vacuum was drawn on the chamber interior. Pump-down was for a 5-minute interval until 1.9 Pa (0.01 torr) was reached. While pump-down was underway, furthermore, argon was flowed in, the chamber interior was reduced in pressure to 13.3 kPa (100 torr), and 200 V of power was supplied to the above-described resistive heating elements to heat the retaining side of the holders to 350° C.

The temperature uniformity of the retaining face was measured using a wafer-surface temperature gauge. In addition, thermal cycling tests were done in which heating up/cooling down the holders between room temperature and 350° C. was repeated 500 times. The temperature-uniformity measurement results, and in the thermal cycling tests—in each of which 10 holders were used—the count of holders with which there were problems such as incidents of cracking or particulates are set forth in Table I.

TABLE I

| | Ceramic-metal composite | | | | Temp. | |
|---|---|---|---|---|---|---|
| No. | Young's modulus (GPa) | $\alpha$ ($\times 10^{-6}$/° C.) | $\kappa$ (W/mK) | Heater substance | uniformity ± (%) | Cycling test |
| 1 | 230 | 7.9 | 102 | Al$_2$O$_3$ | 0.2 | 0 |
| 2 | 230 | 7.9 | 102 | AlN | 0.1 | 0 |
| 3 | 230 | 7.9 | 102 | SiC | 0.1 | 0 |
| 4 | 210 | 12.0 | 54 | Al$_2$O$_3$ | 1.20 | 2 |
| 5 | 210 | 12.0 | 54 | AlN | 0.80 | 3 |
| 6 | 210 | 12.0 | 54 | SiC | 0.70 | 3 |

TABLE II

| Heater substance | $\alpha$ ($\times 10^{-6}$/° C.) | $\kappa$ (W/mK) |
|---|---|---|
| Al$_2$O$_3$ | 7.8 | 29 |
| AlN | 4.6 | 165 |
| SiC | 4.0 | 179 |

It will be understood from Table I that in the cases in which the Al—Al$_2$O$_3$ composite having a thermal expansion coefficient of 7.9×10$^{-6}$/° C. was utilized, the temperature uniformity was within ±0.5%, and among the ten holders run through the thermal cycling tests there were no occurrences of cracking or particulates in any of the ten. On the other hand, it will be appreciated that in the cases in which the Al—Al$_2$O$_3$ composite having a thermal expansion coefficient of 12×10$^{-6}$/° C. was utilized, the temperature uniformity was outside of ±0.5%—depending on the heater material, it was beyond ±1.0%. Furthermore, in each cycling test cracking occurred in 2-3 holders among the ten in these cases.

Embodiment Two

Apart from making the ceramic-metal composite Al—AlN, holders like those of Embodiment 1 were fabricated, and the same evaluations as in Embodiment 1 were made. The results are set forth in Table III. Here, the pump-down time was the same 5-minute interval as in Embodiment 1.

TABLE III

| No. | Ceramic-metal composite | | | Heater sub-stance | Temp. uniformity ± (%) | Cycling test |
| --- | --- | --- | --- | --- | --- | --- |
| | Young's modulus (GPa) | α (×10⁻⁶/° C.) | κ (W/mK) | | | |
| 7 | 210 | 7.5 | 176 | Al₂O₃ | 0.2 | 0 |
| 8 | 210 | 7.5 | 176 | AlN | 0.1 | 0 |
| 9 | 210 | 7.5 | 176 | SiC | 0.1 | 0 |

Embodiment Three

Apart from making the ceramic-metal composite Al—SiC, holders like those of Embodiment 1 were fabricated, and the same evaluations as in Embodiment 1 were made. The results are set forth in Table IV. Here, the pump-down time was the same 5-minute interval as in Embodiment 1. For comparison, furthermore, a holder in which instead of a ceramic-metal composite an isolated Al₂O₃ ceramic was used (No. 20), one in which an AlN ceramic was used (No. 21), and one in which an SiC ceramic was used (No. 22) were prepared, and the results of evaluating these are additionally set forth in Table IV.

TABLE IV

| No. | Ceramic-metal composite | | | Heater sub-stance | Temp. uniformity ± (%) | Cycling test |
| --- | --- | --- | --- | --- | --- | --- |
| | Young's modulus (GPa) | α (×10⁻⁶/° C.) | κ (W/mK) | | | |
| 10 | 200 | 6.2 | 159 | Al₂O₃ | 0.2 | 0 |
| 11 | 200 | 6.2 | 159 | AlN | 0.2 | 0 |
| 12 | 200 | 6.2 | 159 | SiC | 0.1 | 0 |
| 13 | 195 | 7.1 | 162 | AlN | 0.3 | 0 |
| 14 | 180 | 7.6 | 163 | AlN | 0.2 | 0 |
| 15 | 175 | 8.0 | 165 | AlN | 0.2 | 0 |
| 16 | 150 | 10.0 | 162 | AlN | 0.2 | 5 |
| 17 | 125 | 14.4 | 162 | AlN | 0.2 | 7 |
| 18 | 105 | 16.2 | 164 | AlN | 0.2 | 7 |
| 19 | 95 | 17.6 | 162 | AlN | 0.2 | 9 |
| 20 | 390 | 7.8 | 29 | AlN | 0.9 | 4 |
| 21 | 314 | 4.6 | 165 | AlN | 0.3 | 5 |
| 22 | 410 | 4.0 | 180 | AlN | 0.2 | 6 |

The following will be understood from Tables I through IV. The holders in which a ceramic-metal composite was utilized, with there being no occurrences of fractures or the like in the cycling test, excelled over the isolated ceramic holders (Nos. 20-22) in resistance to thermal shock. No problems occurred in the cycling test with those holders whose Young's modulus was 300 GPa or less. Utilizing a ceramic-metal composite having a thermal conductivity of 100 W/mK or more made it possible to bring the temperature uniformity to within ±0.5%. Nevertheless, if the thermal expansion coefficient of the ceramic-metal composite is at a remove from the thermal expansion coefficient of the ceramic susceptor, inasmuch as during high temperature excessive heat stress is produced in the joint between the ceramic-metal composite and the ceramic susceptor, the probability of damage in the cycling test will be high.

Embodiment Four

Apart from having the material of the ceramic-metal composites be Si—Al₂O₃, Si—AlN, and Si—SiC, respectively, and from making the resistive heating element tungsten, holders like those of Embodiment 1 were fabricated, and the same evaluations as in Embodiment 1 were made. The temperature uniformity was with the temperature being 800° C., and the cycling test was 500 heat-up/cool-down cycles between room temperature and 800° C. The results are set forth in Table V. Here, the holders were finished to a planarity of 0.03 mm and a microroughness of 0.7 □m (Ra). The pump-down time to 1.3 Pa with every one of the materials was the same 5-minute interval as in Embodiment 1. In addition, in Table VI the Young's modulus, thermal expansion coefficient (□), and thermal conductivity (□) of the composites utilized are set forth.

TABLE V

| No. | Ceramic-metal composite | Heater substance | Temp. uniformity ± (%) | Cycling test |
| --- | --- | --- | --- | --- |
| 23 | Si—Al₂O₃ | Al₂O₃ | 0.3 | 0 |
| 24 | Si—Al₂O₃ | AlN | 0.2 | 0 |
| 25 | Si—Al₂O₃ | SiC | 0.2 | 0 |
| 26 | Si—AlN | Al₂O₃ | 0.2 | 0 |
| 27 | Si—AlN | AlN | 0.1 | 0 |
| 28 | Si—AlN | SiC | 0.1 | 0 |
| 29 | Si—SiC | Al₂O₃ | 0.2 | 0 |
| 30 | Si—SiC | AlN | 0.1 | 0 |
| 31 | Si—SiC | SiC | 0.1 | 0 |

TABLE VI

| Heater substance | Young's modulus (GPa) | □(×10⁻⁶/° C.) | □(W/mK) |
| --- | --- | --- | --- |
| Si—Al₂O₃ | 265 | 7.0 | 106 |
| Si—AlN | 270 | 4.5 | 167 |
| Si—SiC | 280 | 2.8 | 175 |

Embodiment Five

Holders were created by readying the same 400-mm diameter, 10-mm thickness Si—SiC composites as in Embodiment 4, and combining ceramic susceptors together with the holders likewise as with Embodiment 1. After support parts in the manner of Embodiment 1 were joined to the holders, a thin SiO₂ film 10, as represented in FIG. 6, of some 30 □m thickness was thermal-spray coated over the entire surface of the holder and support part. The holders underwent the same temperature-uniformity evaluation and thermal cycling test at 800° C. as in Embodiment 4. The results are set forth in Table VII.

TABLE VII

| No. | Ceramic-metal composite | Heater substance | Temp. uniformity ± (%) | Cycling test |
| --- | --- | --- | --- | --- |
| 32 | Si—SiC | Al₂O₃ | 0.2 | 0 |
| 33 | Si—SiC | AlN | 0.1 | 0 |
| 34 | Si—SiC | SiC | 0.1 | 0 |

Embodiment Six

Holders of the form shown in FIG. 3 were prepared in the same way as in Embodiment 5, apart from having the size of the Si—SiC composites be the diameters entered in Table VII, and 20 mm thickness, and from making the outer diameters of the ceramic susceptors each 50 mm smaller than the respective diameters of the Si—SiC composites. The same temperature-uniformity evaluation and thermal cycling test at 800° C.

as in Embodiment 5 were performed. The results are set forth in Table VII. Here, the time required for pump-down to 1.3 Pa was a 5-minute interval.

TABLE VIII

| No. | Si—SiC dia. (mm) | Heater substance | Temp. uniformity ± (%) | Cycling test |
|-----|------------------|------------------|------------------------|--------------|
| 35  | 200              | $Al_2O_3$        | 0.1                    | 0            |
| 36  | 200              | AlN              | 0.1                    | 0            |
| 37  | 200              | SiC              | 0.1                    | 0            |
| 38  | 150              | AlN              | <0.1                   | 0            |
| 39  | 100              | AlN              | <0.1                   | 0            |

It will be appreciated that with diameter of the holder being smaller the temperature uniformity improves.

Embodiment Seven

The same Si—SiC composites as well as AlN ceramic susceptors as those utilized in Embodiment 4 were readied. The planarity and microroughness of the retaining faces of the Si—SiC composites were finished to the values set forth in Table IX. These Si—SiC composites and AlN ceramic susceptors were utilized to structure, in the same way as in Embodiment 5, the net form in FIG. 6. These holders underwent the same temperature-uniformity evaluation and thermal cycling test at 800° C. as in Embodiment 5. The results are set forth in Table IX. Here, wise as with Embodiment 1 pump-down reached 1.3 Pa (0.01 torr) in a 5-minute interval.

TABLE IX

| No. | Holder surface planarity (mm) | Holder surface microroughness Ra (□m) | Temp. uniformity ± (%) | Cycling test |
|-----|-------------------------------|---------------------------------------|------------------------|--------------|
| 33  | 0.03                          | 0.7                                   | 0.1                    | 0            |
| 40  | 0.10                          | 0.7                                   | 0.2                    | 0            |
| 41  | 0.50                          | 0.7                                   | 0.3                    | 0            |
| 42  | 0.60                          | 0.7                                   | 0.9                    | 0            |
| 43  | 0.03                          | 1.0                                   | 0.3                    | 0            |
| 44  | 0.03                          | 3.0                                   | 0.4                    | 0            |
| 45  | 0.03                          | 5.0                                   | 1.0                    | 0            |

It will be understood from Table IX that bringing the planarity of the retaining face to within 0.5 mm enables the retaining-face temperature uniformity to be brought within ±0.5%. In turn, making the microroughness of the retaining face 3 □m allows the retaining-face temperature uniformity to be brought within ±1.0%.

Embodiment Eight

Si—SiC composites of 40 mm diameter, 10 mm thickness and, by varying the molding precision, 0.01% and 0.03% water absorption ratio were obtained. Holders of the FIG. 6 configuration likewise as with Embodiment 5 were created utilizing these Si—SiC composites together with AlN ceramic susceptors. The same temperature-uniformity evaluation and thermal cycling test at 800° C. as in Embodiment 5 were performed.

The results were that with a sample (No. 46) in which the Si—SiC composite of 0.01% water absorption ratio was utilized, 30 minutes were necessary to draw a vacuum down to 1.3 Pa; with that of 0.03% water absorption ratio (No. 47), 1 hour was required. It was evident that the time required for pump-down grew longer because the larger the water absorption ratio was, the more likely gas was to issue from the ceramic-metal composite.

The temperature uniformity at 800° C. was ±0.5% in either case, neither of which was as good as the temperature uniformity of the case in which the water absorption ratio was 0.00%. In the thermal cycling test there were no incidents of cracking in 10 out of 10 samples in either case.

Embodiment Nine

Holders of the form shown in FIG. 3 were prepared, done in the same way as in Embodiment 5 apart from having the thickness of the Si—SiC composites be the thicknesses entered in Table X, and the diameter be 400 mm. The same temperature-uniformity evaluation and thermal cycling test at 800° C. as in Embodiment 5 were performed. The results are set forth in Table X. Here, the time required for pump-down to 1.3 Pa was a 5-minute interval.

TABLE X

| No. | Si—SiC thickness (mm) | Heater substance | Temp. uniformity ± (%) | Time to reach 800° C. (hours) |
|-----|-----------------------|------------------|------------------------|-------------------------------|
| 33  | 10                    | AlN              | 0.1                    | 1                             |
| 48  | 20                    | AlN              | <0.1                   | 2                             |
| 49  | 50                    | AlN              | <0.1                   | 3                             |
| 50  | 100                   | AlN              | <0.1                   | 10                            |

Although making the ceramic-metal composites thicker improved the holder temperature uniformity, with the power feed being the same, the heat-up time until 800° C. was reached grew longer. Accordingly, if production efficiency is taken into consideration, then a ceramic-metal composite thickness of 50 mm or less is preferable.

Embodiment Ten

Both the same Si—SiC composites as those used in Embodiment 5 and the same AlN—SiC composites as those used in Embodiment 3, as well as the same AlN ceramic susceptors as those used in Embodiment 5, were utilized to structure the net form in FIG. 6. The coating substance, however, was made those indicated in Table XI. Thermal spraying was the means by which coating was carried out in all cases.

These holders were set up in a chamber interior, into which, with the holders having been heated to 500° C., a corrosive gas ($CHF_3$:$O_2$=14:1) was supplied for 1 hour. As a consequence, the glass joints between the Si—SiC composites and the support parts were corroded (became etched). The etch depths are entered in Table XI. It should be noted that in Table XI, where the "Coating" columns have a "-" indicates that a coating was not formed.

TABLE XI

| No. | Composite substance | Coating substance | Coating thickness (μm) | Depth (μm) |
|-----|---------------------|-------------------|------------------------|------------|
| 30  | Si—SiC              | —                 | —                      | 10         |
| 51  | Si—SiC              | Si                | 28                     | 5          |
| 52  | Si—SiC              | $SiO_2$           | 25                     | 1          |
| 53  | Si—SiC              | AlN               | 27                     | 1          |
| 54  | Si—SiC              | $AlF_3$           | 26                     | 1          |
| 55  | Si—SiC              | DLC               | 9                      | 0          |
| 56  | Si—SiC              | Diamond           | 3                      | 0          |
| 57  | Al—SiC              | —                 | —                      | 22         |
| 58  | Al—SiC              | DLC               | 5                      | 0          |

As is evident from Table XI, the implementation of a coating warded off susceptibility to etching, while being coated with a highly anti-erosive substance such as DLC (diamond-like carbon) or diamond improved the holder's resistance to corrosion. Furthermore, the same temperature-uniformity evaluation and thermal cycling test at 800° C. as in Embodiment 5 were performed, wherein the temperature uniformity was within ±0.5% in either case, and with 10 holders being cycling-tested in all 10 holders there were no incidents of peeling of the coating films or cracking in the ceramic-metal composites.

According to the present invention as in the foregoing rendering a structure in which a composite of a ceramic and a metal is furnished atop a ceramic susceptor contributes to heightening the temperature uniformity in the retaining face, making resistance to thermal shock superlative, and curtailing the generation of particulates and other contaminants. Advantageously the Young's modulus of the composite of a ceramic and a metal is 300 GPa or less. Further, forming a coating on at least the processed-object-retaining side of the holder contributes to improving the holder durability. Installing a holder of this sort in a semiconductor manufacturing device or a liquid-crystal manufacturing device contributes to making available semiconductor or liquid-crystal manufacturing devices whose productivity and throughput are excellent.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A holder for use in semiconductor or liquid-crystal manufacturing devices, comprising:
    a ceramic susceptor; and
    a composite of a ceramic and a metal furnished atop said ceramic susceptor, the ceramic-metal composite having a diameter greater than or equal to that of the susceptor, the composite including a mixture of metallic and ceramic constituents, the mixture including metallic microconstituents distributed in a ceramic matrix, the ceramic metal composite further including a retaining face configured to hold either a semiconductor wafer or LCD glass as a processed object; and
    an electrically resistive heating circuit provided either in the ceramic susceptor, or on a face of the ceramic susceptor opposite the ceramic-metal composite.

2. A holder as set forth in claim 1, wherein the Young's modulus of the ceramic-and-metal composite is 300 GPa or less.

3. A holder as set forth in claim 1, wherein the thermal conductivity of the ceramic-and-metal composite is 100 W/mK or more.

4. A holder as set forth in claim 1, wherein the thermal expansion coefficient of the ceramic-and-metal composite is claim $2.5 \times 10^{-6}$ to claim $8.0 \times 10^{-6}/°$ C.

5. A holder as set forth in claim 1, further comprising a support part supporting the ceramic-and-metal composite.

6. A holder as set forth in claim 1, further comprising a support part supporting the ceramic susceptor.

7. A holder as set forth in claim 1, further comprising a support part supporting both the ceramic-and-metal composite and the ceramic susceptor.

8. A holder as set forth in claim 1, wherein a coating is formed on at least a processed-object-retaining side of the holder.

9. A holder as set forth in claim 1, wherein the ceramic-and-metal composite functions as an electrode.

10. A semiconductor or liquid-crystal manufacturing device in which the holder of claim 1 is installed.

11. A holder as set forth in claim 1, wherein:
    the metal comprises at least one member of the group consisting of Al, Si, and Cu; and
    the ceramic comprises at least one member of the group consisting of SiC, $Al_2O_3$, AlN, WC, and BN.

12. A holder as set forth in claim 1, wherein the ceramic-metal composite comprises at least one compound selected from the group consisting of Al—SiC, Al—$Al_2O_3$, Al—AlN, Si—SiC, Si—$Al_2O_3$, and Si—AlN.

13. A holder as set forth in claim 1, wherein the composite comprises a sintered mixture of metal and ceramic powders.

14. A holder as set forth in claim 1, wherein the composite comprises metal infiltrated into a porous ceramic substrate.

15. A holder for use in semiconductor or liquid crystal manufacturing devices, the holder comprising:
    a support structure disposed in a processing chamber, the support structure anchored to a floor of the processing chamber;
    a ceramic-metal composite provided atop the support structure, the ceramic-metal composite including a substantially uniform mixture of ceramic and metal microconstituents, the ceramic-metal composite further including a retaining face configured to hold either a semiconductor wafer or LCD glass as a processed object;
    a ceramic susceptor disposed on an underside of the ceramic-metal composite such that the ceramic susceptor does not contact either the support structure or the processing chamber.

16. A holder as set forth in claim 15, further comprising an electrically resistive heating circuit provided either in the ceramic susceptor, or on a face of the ceramic susceptor opposite from the ceramic-metal composite.

* * * * *

UNITED STATES PATENT AND TRADEMARK OFFICE
CERTIFICATE OF CORRECTION

PATENT NO.         : 7,414,823 B2                                               Page 1 of 1
APPLICATION NO.    : 10/709889
DATED              : August 19, 2008
INVENTOR(S)        : Manabu Hashikura et al.

It is certified that error appears in the above-identified patent and that said Letters Patent is hereby corrected as shown below:

Column 4, lines 41 and 42, "within 500 ▫m and that the microroughness be 3 ▫m (Ra)" should read --within 500 $\mu$m and that the microroughness be 3 $\mu$m (Ra)--.

Column 7, line 41, "0.7 ▫m (Ra)" should read --0.7 $\mu$m (Ra)--.

Column 7, lines 43 and 44, and lines 62 and 63, as well as column 10, lines 10 and 11, "thermal expansion coefficient (▫), and thermal conductivity (▫)," each occurrence, should read --thermal expansion coefficient ($a$), and thermal conductivity ($k$)--.

Column 8, Table II, (line 41), "▫(× $10^{-6}$/°C)" should read --$a$(× $10^{-6}$/°C)--, and "▫(W/mK)" should read --$k$(W/mK)--.

Column 10, line 7, "0.7 ▫m (Ra)" should read --0.7 $\mu$m (Ra)--; Table VI, (line 29), "▫(× $10^{-6}$/°C)" should read --$a$(× $10^{-6}$/°C)--, and "▫(W/mK)" should read --$k$(W/mK)--; line 43, "30 ▫m" should read --30 $\mu$m--.

Column 11, Table IX, (line 35), "Ra (▫m)" should read --Ra ($\mu$m)--; line 47 "3 ▫m" should read --3 $\mu$m--.

Signed and Sealed this

Eighth Day of September, 2009

David J. Kappos
*Director of the United States Patent and Trademark Office*